United States Patent [19]

Gentischer

[11] Patent Number: 5,628,683
[45] Date of Patent: May 13, 1997

[54] SYSTEM FOR TRANSFERRING SUBSTRATES INTO CLEAN ROOMS

[75] Inventor: Josef Gentischer, Weinbergweg 31, 73630 Remshalden, Germany

[73] Assignee: Josef Gentischer, Remshalden, Germany

[21] Appl. No.: 295,678
[22] PCT Filed: Dec. 17, 1992
[86] PCT No.: PCT/EP92/02931
§ 371 Date: Nov. 28, 1994
§ 102(e) Date: Nov. 28, 1994
[87] PCT Pub. No.: WO93/18543
PCT Pub. Date: Sep. 16, 1993

[30] Foreign Application Priority Data

Mar. 9, 1992 [DE] Germany .................. 42 07 341.3

[51] Int. Cl.⁶ .................................................. F24F 3/16
[52] U.S. Cl. .................. 454/187; 414/217; 414/292; 414/331; 414/411
[58] Field of Search ................ 454/187; 414/217, 414/297, 331, 422, 292, 411

[56] References Cited

U.S. PATENT DOCUMENTS

| | | | |
|---|---|---|---|
| 4,674,939 | 6/1987 | Maney et al. | 414/292 |
| 4,739,882 | 4/1988 | Parikh et al. | 206/454 |
| 4,815,912 | 3/1989 | Maney et al. | 414/217 |
| 4,995,430 | 2/1991 | Bonora et al. | 141/98 |
| 5,261,935 | 11/1993 | Ishii et al. | 55/472 |
| 5,431,600 | 7/1995 | Murata et al. | 454/187 |

FOREIGN PATENT DOCUMENTS

| | | | |
|---|---|---|---|
| 0340345A2 | 11/1989 | European Pat. Off. . | |
| 3826925 | 2/1990 | Germany | 454/187 |
| 62-22933 | 1/1987 | Japan | 454/187 |
| WO86/00870 | 2/1986 | WIPO . | |

OTHER PUBLICATIONS

*Solid State Technology*, No. 8, Westford, MA, US, "Wafer Confinement for Control of Contamination in Microelectronics", Claude Doche, Aug. 1990, pp. S1–S5.
Document #1872—New Standard, SEMI E24, 200 MM "Standard Mechanical Interface (SMIF)", pp. 1–6.

*Primary Examiner*—Harold Joyce
*Attorney, Agent, or Firm*—Jones, Tullar & Cooper, P.C.

[57] ABSTRACT

A system for transferring substrates in a clean room (100) has a box (1) for receiving a cassette (101) that contains the substrates (102), and a bottom (2) that hermetically closes the box (1) and that can be locked and unlocked in the box (1) by a locking mechanism. The locking mechanism has a captive C-washer (25) rotatively mounted in the box bottom (2). The captive C-washer (25) drives locking elements (21a, 21b; 321a, 321b), preferably by means of connecting rods (24a, 24b; 324a, 324b). The locking elements (21a, 21b; 321a, 321b) engage locking slots (11a, 11b) of the box (1). The captive C-washer (25) has catching bores (26a, 26b) engaged by the locking bolts (41a, 41b) of a rotary disk (45) arranged in a lock gate (4). A swivelling movement of the rotary disk (45) driven by a driving device of the system causes the bottom (2) to be locked and unlocked in the box (1). A reception frame (3) allows the box (1) to be accurately positioned and a blocking mechanism blocks the box (1) in the reception frame (3). The blocking mechanism is mechanically coupled to the rotary disk (45), so that when the bottom (2) is locked in the box (1) by a swivelling movement of the captive C-washer (25), the box (1) is unblocked in the frame (3), whereas when the bottom (2) is unlocked from the box (1) by a swivelling movement of the captive C-washer (45), the box (1) is blocked in the reception frame (3).

26 Claims, 13 Drawing Sheets

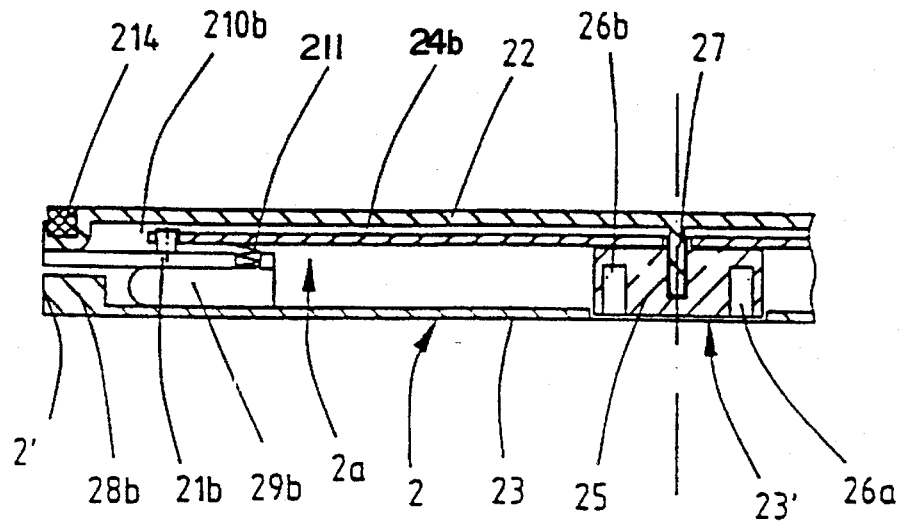
FIG. 3
FIG. 4
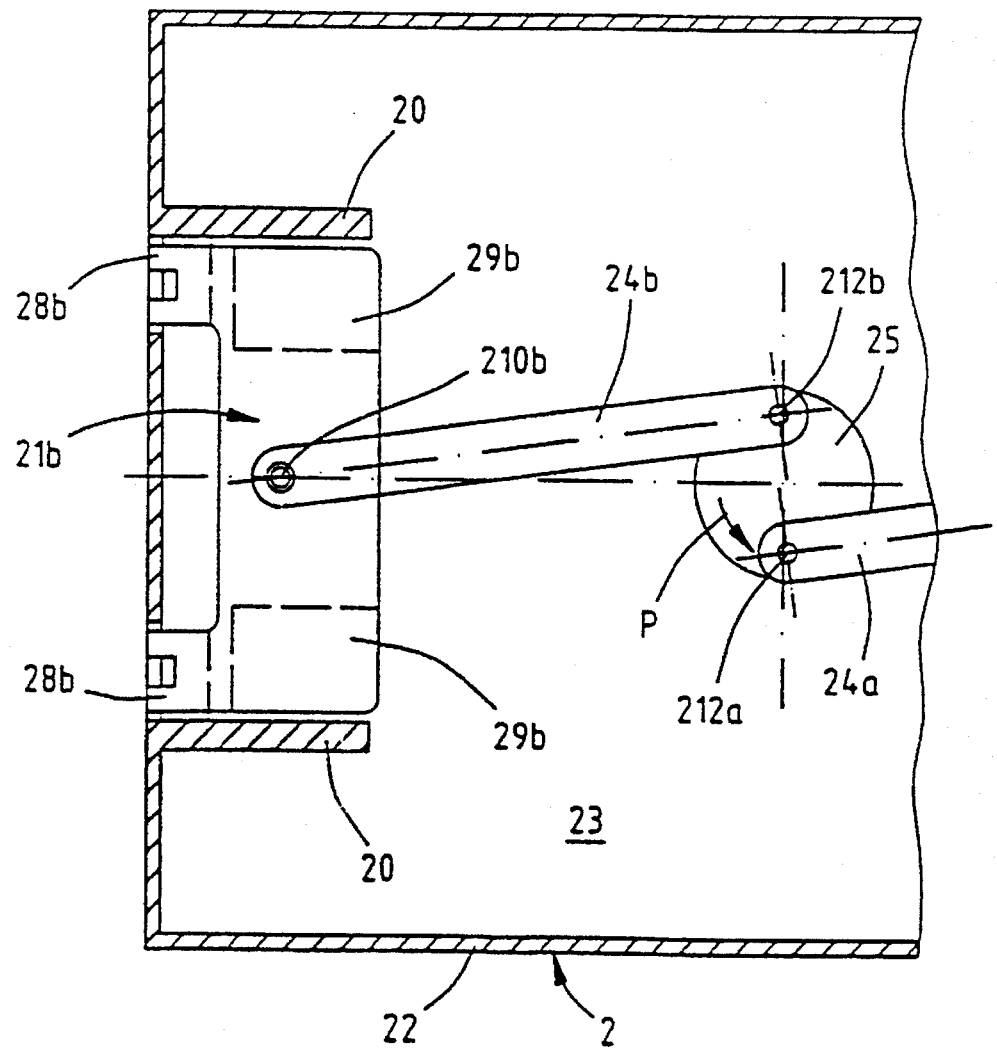

SYSTEM FOR TRANSFERRING SUBSTRATES INTO CLEAN ROOMS

BACKGROUND OF THE INVENTION

The present invention relates to a system for transferring substrates into a clean room, having a box for receiving a cassette containing the substrates, with a box bottom which hermetically seals the box and which can be locked into and unlocked from the box by means of a locking mechanism. The locking mechanism has a pivot disk rotatably seated in the box bottom which, preferably by means of push rods, drives locking elements which engage locking slots in the box pivot disk has engagement bores which are engaged by locking pin of a turntable disposed in a lock gate and which, driven by an operating device of the system, perform a pivot movement triggering the locking and unlocking of the box bottom in the box, having a receiving frame for the positionally correct orientation of the box and a detent mechanism for fixing in place of the box in the receiving frame.

Such a system—identified by the technical term "Standard Mechanical Interface (SMIF)"—is known from U.S. Pat. No. 4,995,430. The serious disadvantage of this system is that the locking mechanism and the detent mechanism are embodied to be completely separated from each other. This has the disadvantageous result that it becomes necessary to provide complex electronic monitoring and control devices which are intended to assure that, on the one hand, locking of the box bottom in the box is only terminated once the box has been fixed in place in the receiving frame and, on the other hand, that the box bottom is locked in the box before the fixing in place of the box in the receiving frame is removed.

A further disadvantage of the known system resides in that here the operating device for locking and unlocking of the box bottom in the box by means of the turntable normally provided for this is disposed underneath the lock gate. This has the disadvantageous result that the known system cannot be integrated into clean room installations. Instead, the SMIF must be docked to the clean room installation. A separate lifting device is then required for lowering the lock gate. Furthermore, a separate transporting device is required, which transports the substrate cassette of the known system from the lowered lock gate to a lifting device of the clean room installation from where the further manipulation of the cassette with the substrates contained therein is performed. The separate lifting device required with the known SMIF systems and the transport device moving the substrate cassette from the lifting device of the SMIF to the lifting device of the clean room makes the construction of the known SMIF system more expensive and complicated in a disadvantageous way.

A further disadvantage rests in the complicated design of the locking mechanism. To achieve the tilting movement of the locking elements at the end of the locking process of the box bottom in the box, it is provided that the pins by means of which the push rods are linked with the pivot disk are guided in a cam way of the pivot disk so that by means of an elevation of the link point of the push rods a tilting movement of the locking elements is achieved. Such a structural solution is not only complicated and therefore expensive for producing the pivot disk along with the cam ways, it also disadvantageously increases the structural height of the box bottom. In addition, such a construction entails excessive wear of the pins and the cam way because of the increased material stresses thereon occurring in the course of the tilting of the locking elements.

A further disadvantage of the known system lies in its lack of consideration of the technical air requirements necessary in clean room installations to prevent the contamination of the highly sensitive substrates. No devices are provided in the known system which keep away airborne particulates which possibly have penetrated into the clean room. In this case this disadvantage of the known system has particularly serious effects because the lifting device itself, which is disposed in the clean room and which lowers the lock gate, brings such airborne particulates into the clean room: abrasion particles are generated around the lifting device which are subject to friction and which in the known system reach the portion of the clean room receiving the substrates in a disadvantageous manner.

SUMMARY OF THE INVENTION

It is the object of the present invention to further develop a system of the type mentioned at the outset in such a way that the above described disadvantages are avoided.

This object is attained in that the detent mechanism is mechanically connected with the turntable in such a way that a pivot movement of the turntable, which triggers locking of the box bottom in the box, causes the termination of the fixing in place of the box in the receiving frame, and that a pivot movement of the turntable, which triggers termination of the locking of the box bottom in the box causes fixing in place of the box in the receiving frame.

By means of the measures in accordance with the present invention a forced locking of the box bottom in the box and of the box in the receiving frame is achieved in a particularly advantageous manner. Thus, an elaborate electronic monitoring and control device is no longer required to assure, on the one hand, that the box bottom is not unlocked until the box is fixed in place in the receiving frame or, on the other hand, the fixing in place of the box in the receiving frame is not terminated without the box bottom first having been fixed in place in the box. Thus, the measures proposed in accordance with the present invention advantageously effect the assured and dependable prevention of contamination of the substrates.

An advantageous development of the present invention provides that the coupling of the detent mechanism and the locking mechanism take place in such a way that a cam plate is rigidly connected with the turntable of the lock bottom. The cam plate has control cams in each of which a bolt is guided and is connected with a further push rod. The rotary motion of the turntable is translated into a linear displacement motion of the further push rods, by means of which the pivot movement of a detent element acting on shoulders of the box in the latter can be controlled. Such a mechanical linkage of the locking and unlocking of the box bottom in the box with the fixing in place of the box in the receiving frame is distinguished particularly advantageously by its structural simplicity.

A further advantageous development provides that the control of the pivot movement of the detent elements takes place by means of the control cams of the cam plate, which have a constant radius over a first area and an increasing radius in a following second area. When the bolts connected with the further push rods travel through this second area of the control cams of the cam plate, the increasing radius of the control cams in an advantageous manner causes a linear displacement movement of the further push rods, which then act upon a pivot lever which is connected via a bolt with a detent element. Because of this the detent element is moved against the spring force of a pivot spring out of its detent position into its receiving position in the receiving frame. This type of control of the detent elements has the advantage—besides its constructive simplicity—that only a few mechanical parts are needed for the assured and dependable triggering and control of the pivot movement of the detent elements, because of which such a detent mechanism can be manufactured particularly simply and inexpensively.

A further advantageous development of the present invention provides that the operating device driving the detent mechanism as well as the locking mechanism is completely disposed in the interior chamber of the lock gate. This feature has the advantage that the system in accordance with the present invention can be integrated particularly simply into clean room installations. By means of it it is possible for the lifting device of the clean room to act directly on the lock gate. Thus, with the system of the present invention lowering of the lock gate together with the box bottom and the substrate cassette placed thereon is performed by the lifting device of the clean room. It therefore is no longer required—as in the known installation—to dock the system to the clean room and to provide a separate lifting device for lowering the lock gate as well as a separate transport device for transporting the cassette from the lifting device of the system to the lifting device of the clean room. Thus, in an advantageous manner these measures of the present invention achieve for one thing an increase in the employment range of the system of the present invention in relation to known systems, because the system of the present invention can be integrated into clean room installations. For another thing, a separate lifting device and a separate transport device are no longer advantageous, because of which the manufacturing costs of such clean room installations can be considerably reduced.

In a particularly advantageous manner the operating device, which is completely disposed in the interior of the lock gate, is formed by a bracket, which is hingedly seated in a pivot point, a motor received in the bracket, on the motor shaft of which a threaded spindle is flanged which meshes with a counter-screw thread of a fork which, via a second hinge point, connects the cam plate which is rigidly connected with the turntable of the lock gate. This construction in accordance with the present invention of the operating device of the system of the present invention is not only distinguished by its structurally simple design but also by its compactness, because of which the disposition of the operating device in the interior of the lock gate can be uncomplicated and especially simple in a particularly advantageous manner.

A further advantageous development of the present invention represents an alternative embodiment of the above described common operating device for the detent and locking mechanism. It is provided here that this operating device has a gear motor, on the motor shaft of which a worm has been flanged. This engages a worm wheel fixedly connected with a pinion. In turn, the pinion is in engagement with the cam plate embodied as a spur wheel. It is advantageously achieved by these measures that the gear motor can be installed horizontally in the lock gate, the result of which is an advantageous particularly compact construction of the operating device of the present invention and thus a space-saving embodiment of the lock gate receiving this operating device.

A further advantageous development of the present invention provides that the locking element of the locking mechanism has at least one runner which slides on the underside of a housing of the box bottom and cooperates with a stop on the housing. This stop limits the linear displacement movement of the locking element, triggered by the push rod, in the direction of an associated locking slot of the box and—with further movement of the push rods—provides, in a particularly advantageous manner, that the tilting of the locking element can be achieved in a particularly simple and material-protecting manner. It is furthermore provided by the present invention that the push rods, which are each rotatably fastened on the pivot disk of the box bottom via a link, are moved beyond dead center of the links in the course of the pivot movement causing locking of the box bottom. By means of this measure it is achieved in an advantageous manner that locking of the box bottom in the box is assuredly and dependably safe from automatic opening.

A further advantageous development represents an alternative embodiment of the above described locking mechanism. It is provided in accordance with the present invention that the locking element of the locking mechanism has at least one slider which is displaceably guided in a guide element. A rotatably seated bar is linked with the slider, which translates the linear displacement movement of the locking element in the direction of the associated locking slot of the box, triggered by the push rod which preferably is in the form of a toggle lever, into a rotating movement of its end, which preferably is embodied as a beak, by means of which the box bottom is assuredly and dependably locked in the box. An extremely strong locking force between the box and the box bottom is created in an advantageous manner by these measures of the present invention, which results in a particularly large force effect on a seal disposed between the box and the box bottom.

A further advantageous development of the present invention provides that a ventilating device for the clean room is provided, by means of which a clean air flow which flows around the substrates is fed into the clean room. The technical air requirements of such a clean room installation are met by means of the ventilating device for the clean room provided by the present invention. In an advantageous manner the clean air flow supplied provides rinsing of the substrates. The displacement flow caused by the clean air flow prevents the inflow of contaminated air to the very delicate substrates, so that their contamination by airborne particulates possibly present in the clean room is prevented. The direction of the clean air flow is advantageously selected to be parallel to the surface of in flowing substrates, so that a turbulence-free course of the clean air flow in the clean room is assured.

An advantageous development of the present invention provides that a grid element is provided in the clean room which in a particularly advantageous manner causes the steadying of the clean air flow flowing through the clean room. In this case the grid element is preferably disposed in front—viewed in the flow direction of the clean air flow—of a lifting device integrated into the clean room. By this disposition in accordance with the present invention it is achieved in an advantageous manner that the grid element, in addition to its air guidance functions, also provides a mechanical screen of the part of the clean room which contains the lifting device, so that abrasion particles generated in the course of a lifting movement of the lifting device cannot directly come into the part of the clean room containing the substrates.

A further advantageous development of the present invention provides that after flowing through the part of the clean room containing the substrates, the clean air flow is guided to the lifting device integrated into the clean room. By means of the washing of the lifting device by the clean air flow provided in accordance with the present invention, abrasion particles being created on the parts of the lifting device subjected to friction are kept away from the part of the clean room containing the substrates and are moved away in an advantageous manner by the clean air flow and in this way removed from the clean room. A definite increase in meeting the technical air requirements of such a clean room installation is achieved by this measure of the present invention.

A further advantageous development of the present invention provides that a substrate fastening device is disposed in the box, which has a scissors brace cooperating with the box bottom, by means of which a lifting motion of the box bottom is translated into a pressing movement of a pressure strip connected with the scissors brace against the substrate received in the cassette. An assured fixed seating of the substrate in the cassette during a removal or transport operation is achieved by this measure of the present invention.

BRIEF DESCRIPTION OF THE DRAWINGS

Further details of the present invention can be taken from the exemplary embodiments which will be described below in connection with the drawings. Shown are:

FIG. 3, which is a section through a box bottom of the first exemplary embodiment, FIG. 4, which is a section through the box bottom along the line IV—IV of FIG. 2, FIG. 5, which is a section through a receiving frame of the first exemplary embodiment, FIG. 6, which is a top view of the receiving frame from the direction VI of FIG. 2, FIGS. 7 and 8, which show parts of the detent device of the exemplary embodiment, FIG. 9, which is a bottom view of a lock gate without the bottom plate of the first exemplary embodiment, FIGS. 10 and 11, which show a section through a second exemplary embodiment, FIG. 12, which is a section through the second exemplary embodiment along the line XII—XII of FIG. 10, FIG. 13, which is a section through a box bottom of the second exemplary embodiment, FIG. 14, which is a section through the box bottom along the line XIX-XIV of FIG. 13, FIG. 15, which shows a detail Y of FIG. 10 without a cassette on an enlarged scale and corresponding to a section along XV—XV of FIG. 14, FIG. 16, which is a bottom view of a lock gate without the bottom plate of the second exemplary embodiment, and FIG. 17, which is a section through the detail X of FIG. 16 along the line XVII—XVII of this figure on an enlarged scale.

DETAILED DESCRIPTION OF THE PREFERRED EMBODIMENTS

Figure 1:
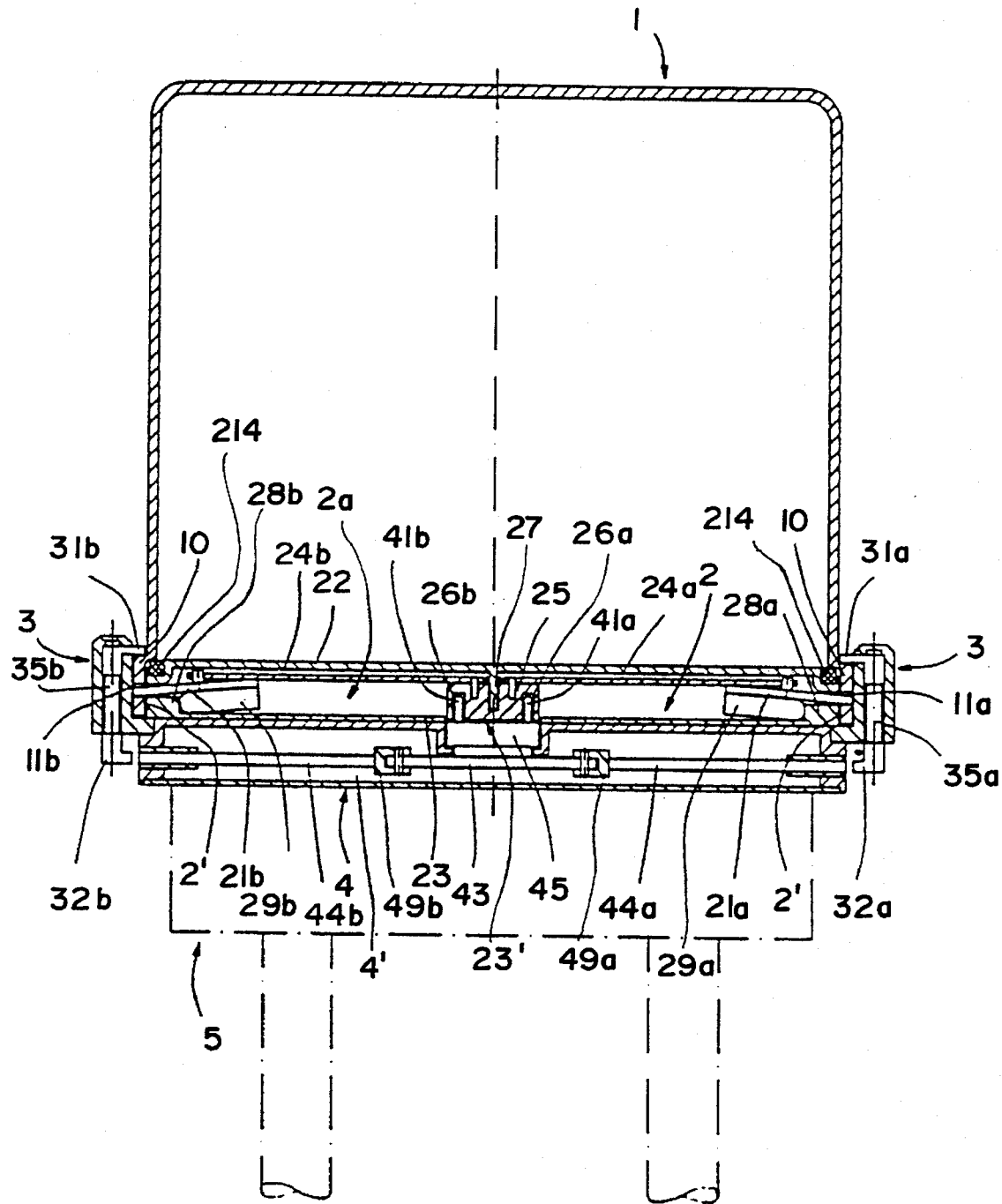
FIG. 1, which is a section through a first exemplary embodiment.
Figure 2:
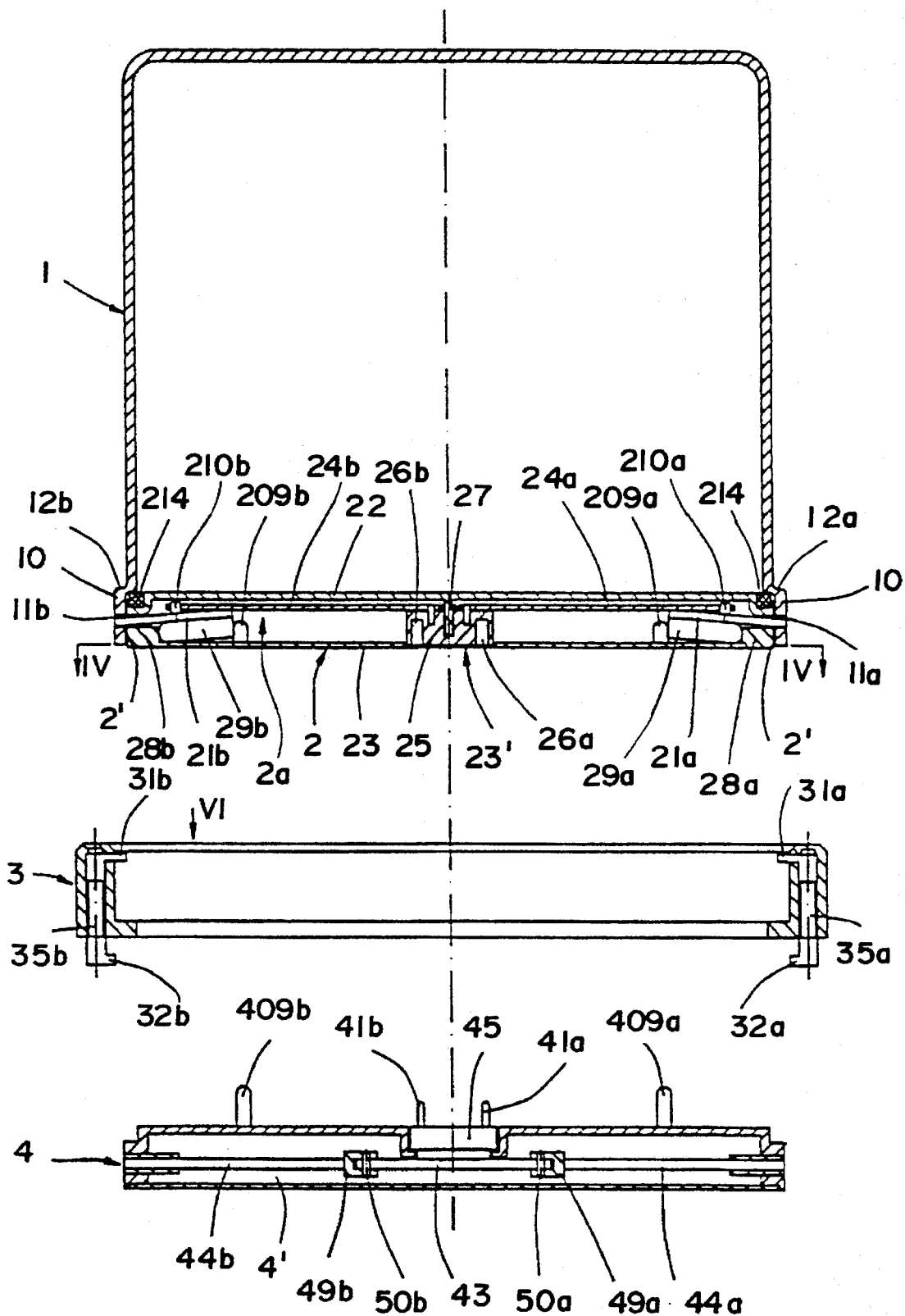
FIG. 2, which is an exploded view of FIG. 1.

The first exemplary embodiment of a system for transferring substrates into clean rooms represented in FIGS. 1 and 2 has a box 1, a box bottom 2, a receiving frame 3 and a lock gate 4. The space enclosed by the box 1 and the box bottom 2 is used in a known manner for receiving a cassette with substrates, not represented in FIGS. 1 and 2, which are intended to be conveyed to a clean room, not shown, located below the lock gate 4.

In its lower area 10 adjoining the lateral surfaces 2' of the box bottom 2, the box 1 has two locking slots 11a, 11b, which are respectively engaged by a locking element 21a, 21b of the locking mechanism of the box bottom 2. Reference is made in this connection to FIGS. 3 and 4, wherein respectively only the left half of the symmetrically constructed locking mechanism is shown. The locking mechanism, disposed in a hollow chamber 2a enclosed by a housing 22 of the box bottom 2, has a pivot disk 25 which is rotatable around a peg 27 of the housing. One end of a push rod 24a, 24b is linked, respectively, via one joint 212a, 212b on the top of the pivot disk 25 (as shown in FIG. 4), the other end of the push rod 24a, 24b is connected, respectively via another joint 210a, 210b with the locking element 21a, 21b embodied as a bar. Each locking element 21a and 21b has respectively two runners 29a and 29b, which are disposed on the back end of the locking element 21a, 21b associated with the pivot disk 25 and which slide on the underside 23 of the housing 22 of the box bottom 2. Respectively one pressure spring 211 (see FIG. 3) acts on a depression disposed in the rear area of the locking element 21a, 21b and is supported on the associated push rod 24a, 24b and prevents the locking element 21a, 21b from pitching down on the underside 23 of the housing 22 in the course of its displacement move, which is triggered by the rotating movement of the pivot disk 25 and transmitted by the push rods 24a, 24b. In addition, the housing 22 has respectively two stops 28a, 28b, which cooperate with the runners 29a, 29b of each locking element 21a, 21b and which limit the linear displacement movement of the locking elements 21a, 21b, guided by guide elements 20 (FIG. 4) of the housing 22, in the direction of the locking slots 11a, 11b.

The described manner of operating the locking elements 21a, 21b by means of the push rods 24a, 24b is not the only possible type of construction. Instead, on the basis of the above description, one skilled in the art can determine which alternatives he can employ to translate the movement of the pivot disk 25 into a locking and unlocking movement of the locking elements 21a, 21b. Reference is made by way of example to the description hereinafter of a second exemplary embodiment, and in particular to FIGS. 15 and 16.

Locking of the box bottom 2 in the box 1 is performed as follows: when the pivot disk 25 is pivoted in the direction of the arrow P (FIG. 4), the push rods 24a, 24b move the locking elements 21a, 21b associated therewith outwardly. The latter first performs a linear movement and in the process engages the locking slots 11a, 11b of the box 1. As soon as the runners 29a and 29b push against the stops 28a and 28b, the locking elements 21a, 21b are tilted. Clamping between the box 1 and a seal 214 extending around the entire circumference of the box bottom 2 is caused by means of this, wherein a particularly strong force effect on the seal 214 of the box bottom 2 is achieved in an advantageous manner because of the toggle lever effect of the push rods 24a, 24b occurring as a result of the tilting of the locking elements 21a, 21b. Therefore the seal is particularly strongly pushed against the box 1. Because of this, hermetic sealing of the space bordered by the box 1 and the box bottom 2 locked in it becomes possible without danger to transporting of the cassette contained in it together with the substrate through contaminated rooms.

It is provided in a particularly advantageous manner that in the course of the pivot movement of the pivot disk 25 the push rods 24a, 24b are moved beyond dead center of the joints 212a, 212b. Self-locking of the closing mechanism is achieved by means of this tripping, so that locking of the box bottom 2 in the box 1 is securely and dependably safe from automatically opening.

The underside 23 of the housing 22 has an opening 23', so that the locking pins 41a, 41b of a turntable 45 of the lock gate 4 disposed beneath the box bottom 2 can enter the engagement bores 26a, 26b provided on the underside of the pivot disk 25. In addition, there are several, preferably three, alignment bores 209a, 209b (see FIG. 2) in the underside 23 of the housing 22 of the box bottom 2, which act together with associated alignment projections 409a, 409b (see FIG. 2) of the lock gate 4 and which, together with the receiving frame 3, take care of a positionally exact orientation of the box bottom 2 and the box 1.

Figure 5:
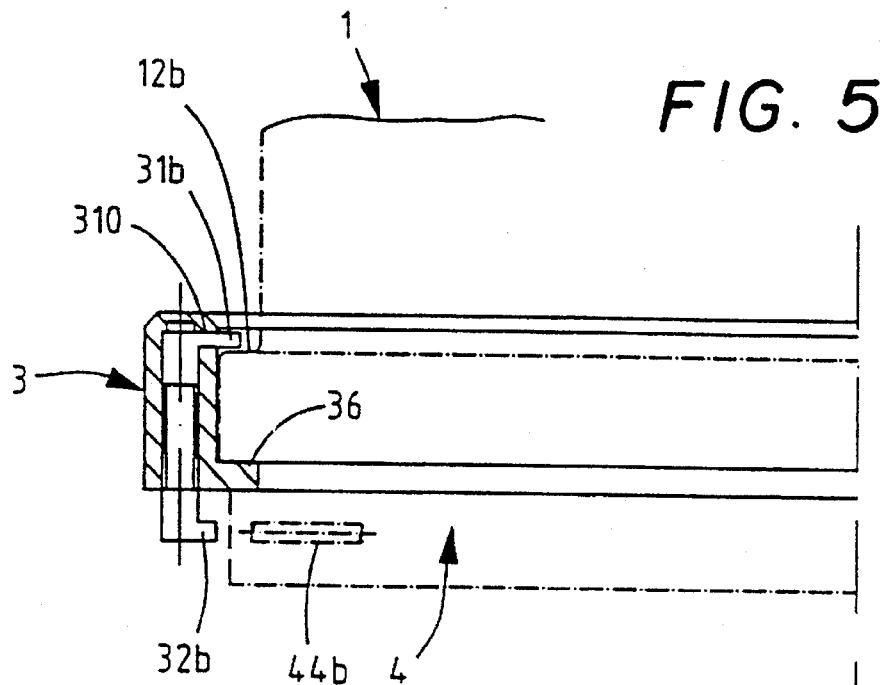
Figure 6:
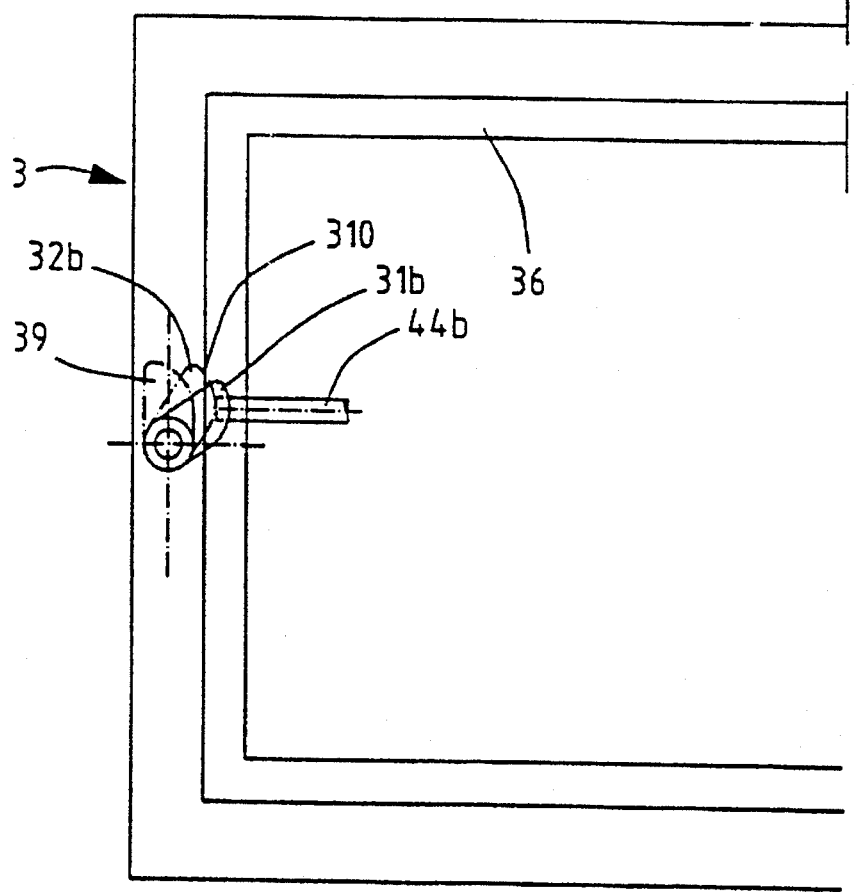
Figure 7:
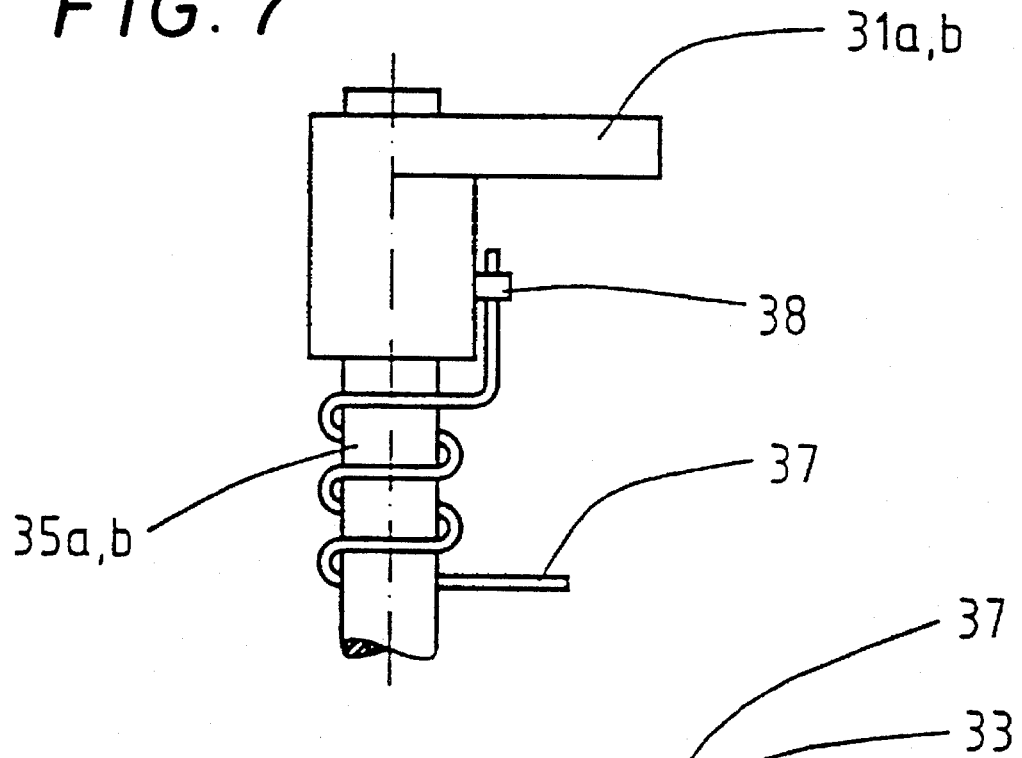

Detent elements 31a and 31b are used for fixing the box 1 in place in the receiving frame 3 and act on a radially outwardly directed shoulder 12a and 12b of the box 1 (see FIG. 2). The detent elements 31a, 31b are components of a symmetrically constructed detent mechanism, the left half of which is shown in detail in FIGS. 5 to 8—to which reference is made—. Two cutouts 39 (see FIGS. 6 and 8) are disposed in the receiving frame 3, which permit a backward pivoting of the detent elements 31a, 31b from the locking position shown in FIGS. 1 and 2 into a receiving position in which they are positioned in the interior of the receiving frame 3 and therefore make possible the easy insertion of the box 1 into the receiving frame 3. Each detent element 31a, 31b is placed on a bolt 35a, 35b—as can be best seen in FIG. 7—, which respectively has a pivot lever 32a, 32b on its lower end (FIGS. 1, 2 and 5) which cooperates with respectively one further push rod 44a, 44b extending out of the inner chamber 4' of the lock gate 4. Action on the pivot levers 32a, 32b by the further push rods 44a, 44b guided in guides 48a, 48b of the lock gate 4 results in the detent elements 31a, 31b being pivoted, through slots 310 of the receiving frame 3 into their receiving position in cutouts 39 of the receiving frame 3 against the spring force of respectively one pivot spring 37 (FIG. 7), coaxially disposed with respect to the bolt 35a, 35b, out of their detent position, in which they act on the shoulders 12a, 12b of the box 1 and lock them in this way in the receiving frame (3).

Figure 8:
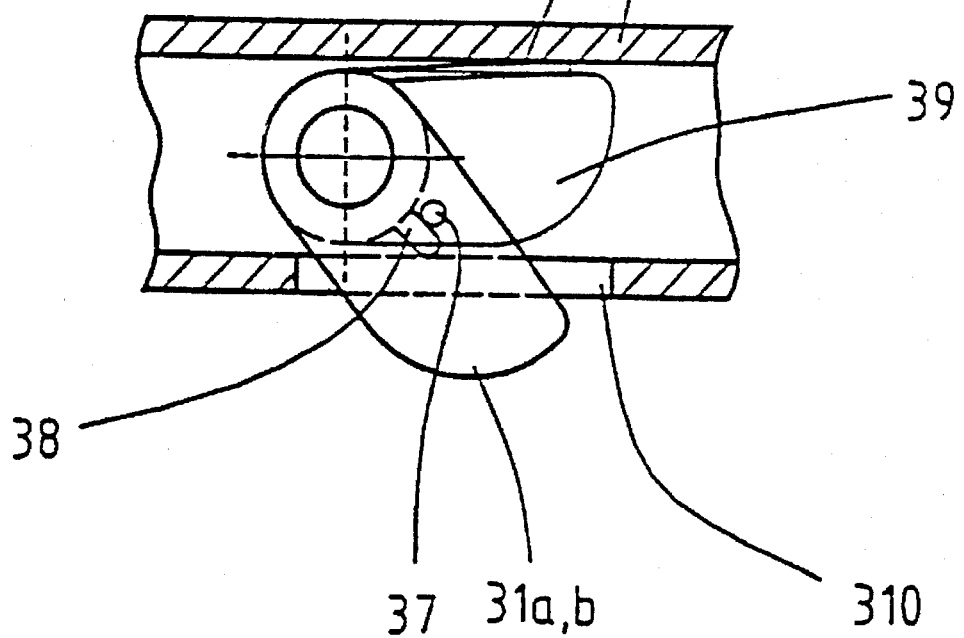

In this connection it has been provided that a first end of each pivot spring 37 acts on a radially inward extending projection 38 of the detent elements 31a, 31b, which is simultaneously used as a stop and is supported on the housing 33 of the receiving frame 3 and in this way limits the pivot angle of the detent elements 31a, 31b (FIG. 8). A second end of the pivot spring is supported on the receiving frame 3.

Figure 9:
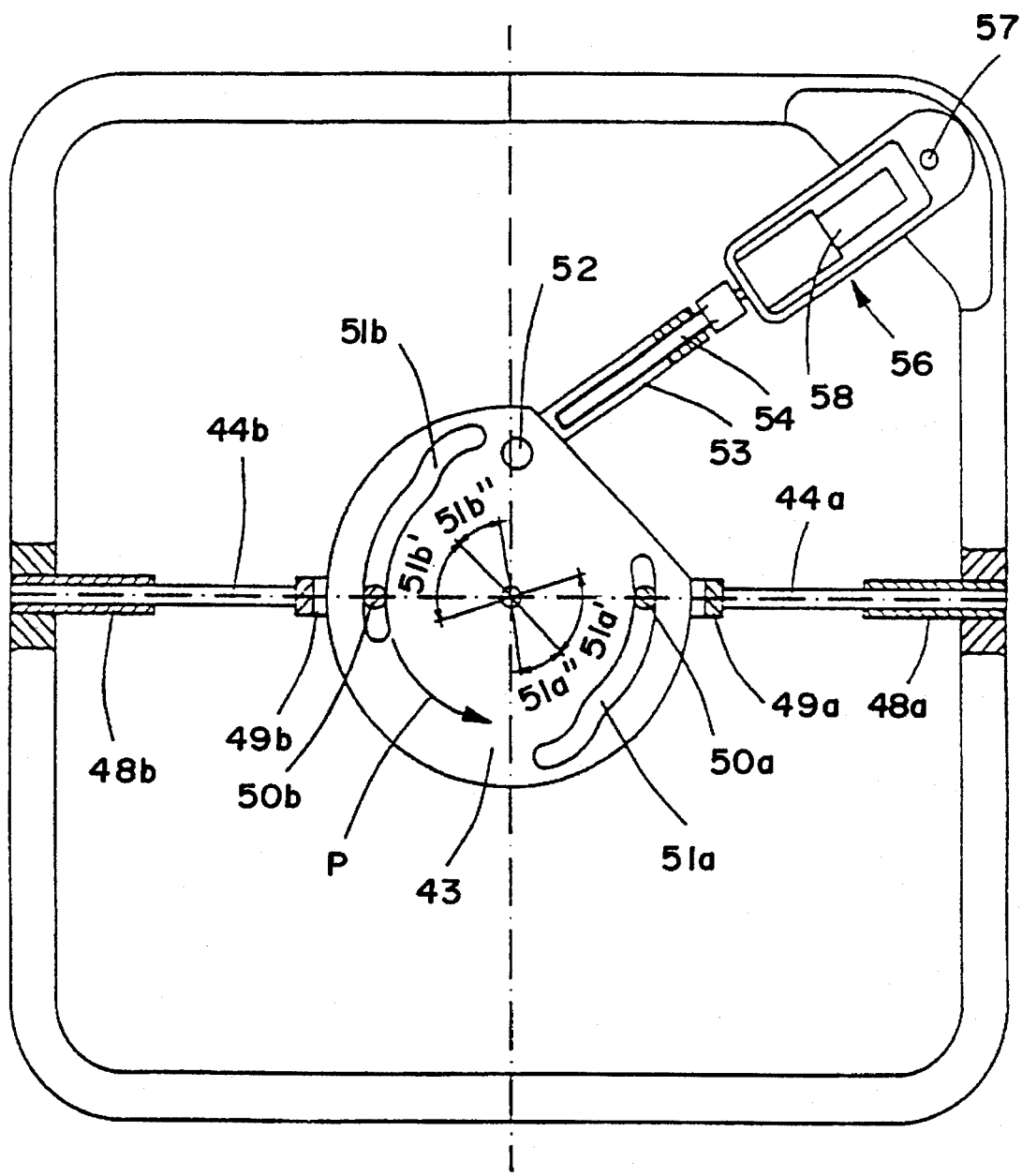

The further push rods 44a, 44b are provided on their ends facing away from the pivot levers 32a, 32b with respectively one fork 49a, 49b—as can best be seen from FIGS. 1, 2 and 9—, which via respectively one bolt 50a, 50b engage control cams 51a, 51b of a cam plate 43, fixedly connected with the turntable 45. Reference is made in this connection to FIGS. 2 or 9. In this case the control cams 51a, 51b of the cam plate 43 are designed in such a way that they have a constant radius in a first area 51a', 51b'. This radius is of such a dimension that the further push rods 44a, 44b do not act on the pivot levers 32a, 32b or— preferably—have retreated into the inner chamber 4' of the lock gate 4 when the bolts 50a, 50b move in the first area 51a', 51b' of the control cams 51a, 51b of the cam plate 43.

In a second area 51a", 51b" adjoining this first area 51a', 51b', the radius of the control cams 51a, 51b increases, so that with a continued pivoting movement of the cam plate 43 in the direction of the arrow P the further push rods 44a, 44b, which are connected via the bolts 51a, 51b with the cam plate 43, are radially displaced outwardly and act on the pivot levers 32a, 32b. The pivot movement of the pivot levers 32a, 32b triggered by this movement is transmitted via the bolts 35a, 35b to the detent elements 31a, 31b, as a result of which they retreat from the shoulders 12a, 12b of the box 1 into the cutouts 39a, 39b of the receiving frame 3 and in this way release the box 1.

This pivot movement of the cam plate 43 is effected by the operating device represented in FIG. 9, which is disposed in a particularly advantageous manner in the inner chamber 4' of the lock gate 4. This measure has, as a result, the fact that the lifting device 5 (FIG. 1) of the clean room can act directly at the lock gate 4. In this way it becomes possible to embody the described lock system as an integral component of the clean room. Therefore there is no longer a dependence—as in the known systems, to dock it against the clean room and to provide a separate lifting device for lowering the lock gate 4 together with the box bottom 2. An operating device for the detent mechanism disposed outside of the lock gate 4, which therefore is interfering, is no longer necessary.

The common operating device for the detent and the locking mechanism has a bracket 56 which is hingedly seated by a pivot pin 57. A motor 58 with attached gear is received in the bracket 56. A threaded spindle 54 is flanged to the motor shaft of the motor 58 and meshes with a counter-screw thread of a fork 53. The fork 53 connects the cam plate 43 via a second hinge pin 52.

Summarizing the structural design of the described system it should be stated that the dimensioning and the particular sizes of this "Standard Mechanical Interface" are recited in Document No. 1872 of the SEMI Standard (Semiconductor Equipment and Materials International). Explicit reference to this document is therefore made. For one skilled in the art, the measurements not contained therein inevitably result from the above description, so that their explicit listing can be omitted here.

The functional progress during transferring a cassette filled with substrates and contained hermetically sealed in the box 1 is as follows:

In the locked position of the system for transferring substrates to clean rooms, the lock gate 4 is firmly pressed against the cover frame 36 of the receiving frame 3 by the lifting device 5 of the clean room installation, so that the clean room located under the lock gate 4 is hermetically sealed. The further push rods 44a, 44b of the lock gate 4 are extended and act on the pivot levers 32a, 32b of the detent mechanism for the box 1. The detent elements 31a, 31b, connected with the pivot levers 32a, 32b via the bolts 35a, 35b, have retreated into the cutouts 39a, 39b of the receiving frame 3, so that the box 1, together with the box bottom 2, which is locked into it by means of the locking elements 21a, 21b, can be seated into the receiving frame 3. The locking pins 41a, 41b of the turntable 45 of the lock gate 4 are in their receiving position, so that they can enter into the engagement bores 26a, 26b of the pivot disk 25 of the box bottom 2 when the box 1 is inserted.

After the box has been placed, the motor 58 received in the bracket 56 is activated and places the cam plate 43 in motion in the direction of the arrow P (FIG. 9) via the threaded spindle 54 and the counter-screw thread provided in the fork 53. The bolts 50a, 50b are moved along the second curve areas 51a", 51b" of the control cams 51a, 51b in the direction of the first curve areas 51a', 51b' by means of this pivot movement of the cam plate 43. As a result the push rods 44a, 44b are retracted. The spring force of the pivot springs 37 pushes the detent elements 31a, 31b through the slots 310 of the receiving frame 3 out of their receiving position into their detent position, so that they act on the outwardly protruding shoulders 12a, 12b of the box 1 and in this way lock the box 1 in the receiving frame.

The pivot movement of the cam plate 43 is transmitted via the locking pins 41a, 41b of the turntable 45, which is fixedly connected with the cam plate 43, to the pivot disk 25. This causes the push rods 24a, 24b to retreat, as a result of which the locking elements 21a, 21b of the box bottom 2 are retracted and retreat into the interior of the housing 22 of the box bottom 2. The locking of the box bottom 2 to the box 1, which is now firmly maintained in the receiving frame 3 by the detent elements 31a, 31b, is terminated by this and the box bottom 2 is released.

The lock gate 4 together with the box bottom 2 and the substrate cassette placed on it are then lowered into the clean room with the aid of the lifting device 5.

In the opposite direction of the functional progress, the pivot movement of the cam plate 43 in the opposite direction (opposite the direction of the arrow P) is first translated by the locking pins 41a, 41b into a pivot movement of the turntable 25, as a results of which the push rods 24a, 24b move the locking elements 21a, 21b outward in the direction toward the locking slots 11a, 11b of the box 1 until they finally enter the locking slots 11a, 11b and—as already described above—seal the box bottom 2 hermetically in the box 1. By means of a further pivot movement of the cam plate 43, the further push rods 44a, 44b come out of the housing of the lock gate 4, act on the pivot levers 32a, 32b, as a result of which the detent elements 31a, 31b recede through the slots 310a, 310b of the receiving frame into the cutouts 39a, 39b of the latter against the displacement force of the pivot springs 37. The box 1, together with the box bottom 2 locked together with it is now no longer locked in the receiving frame 3. Therefore it can be easily taken out of the lock area formed by the receiving frame 3 and the lock gate 4.

Figure 10:
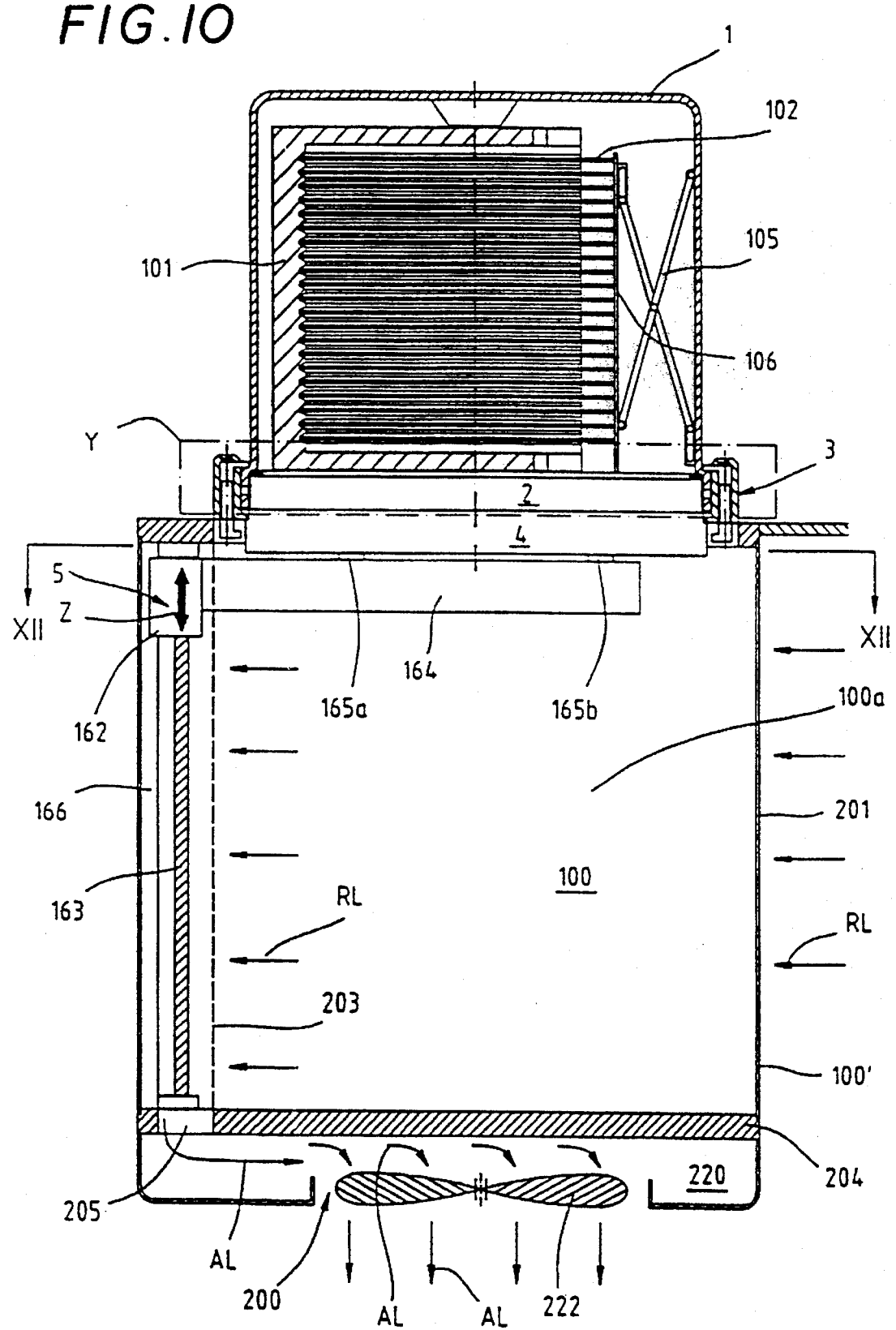
Figure 11:
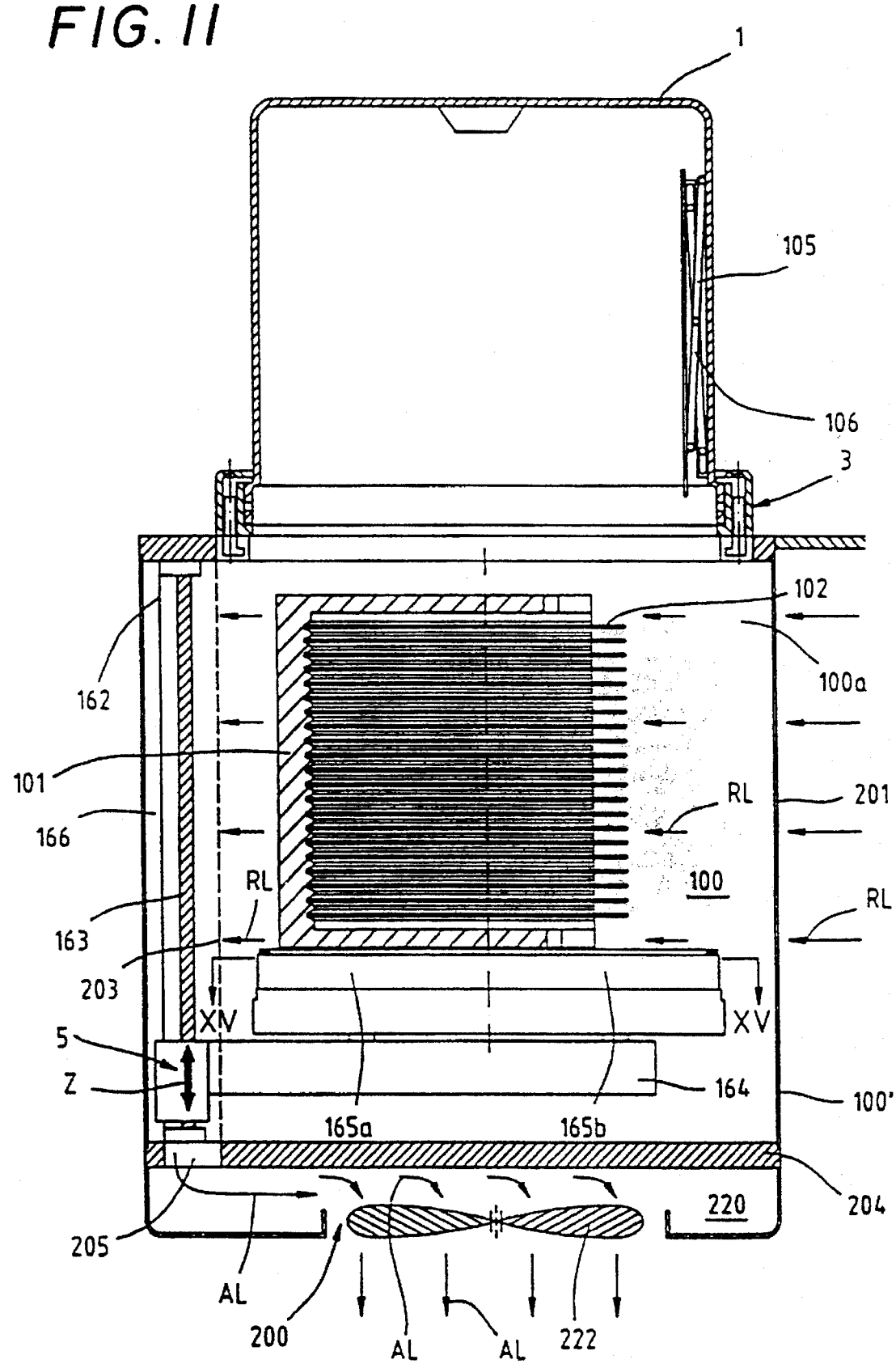

The second exemplary embodiment shown in FIGS. 10 and 11 agrees to a large extent with the above described first exemplary embodiment, so that the same reference numerals can be used for like parts. For the purpose of a short and precise description of the second exemplary embodiment the parts and elements which had already been extensively described in the first exemplary embodiment will therefore not be described again in what follows.

The immediately noticeable difference between FIG. 1 and FIGS. 10 and 11 consists in that the clean room 100 situated underneath the lock gate 4, which had not been illustrated in FIG. 1 and had only been described in words in the explanation of the first exemplary embodiment, is now explicitly shown in these drawing figures. Furthermore, a cassette 101 with substrates 2 is shown in FIGS. 10 and 11, wherein the cassette 101 is shown in its received position in FIG. 10, and in its position where it is lowered into the clean room 100 in FIG. 11.

One difference between the first and second exemplary embodiments of a system for transferring substrates into clean rooms lies in a scissors brace 105 fastened on the side of the box 1, which fixes the substrates 102 in the cassette 101 by means of a pressure strip 106. This is accomplished in that in the closed state of the system the pressure strip 106 of the scissors brace 105 is pushed upward by the box bottom 2. In the course of this the scissors brace 105 opens and pushes the pressure strip 106 against the substrates 102 and in this way causes them to be fixed in place in the cassette 101. With the box bottom 2 lowered, the scissors brace 105 with the pressure strip 106 comes to rest against the wall 1' of the box 1 because of its own weight and releases the cassette 101, so that it can be easily inserted into the clean room 100 (FIG. 11).

A substrate fixing device of the box 1 is formed by the scissors brace 105 and the pressure strip 106 which assures in an advantageous manner the fixing in place of the substrates 102 in their cassette 101. Therefore the box 1 together with the cassette contained in it and the substrates 102, can be taken from the receiving frame 3 and transported without having to fear that the substrates 102 will fall out of the cassette 101 because of vibrations or jarring occurring during the removal or transport operation. Thus a simple manipulation of the box 1 during its removal from the receiving frame 3 or during transport is assured, because even a non-horizontal removal or transport position of the box 1 cannot result in damage to the substrates 102.

Figure 12:
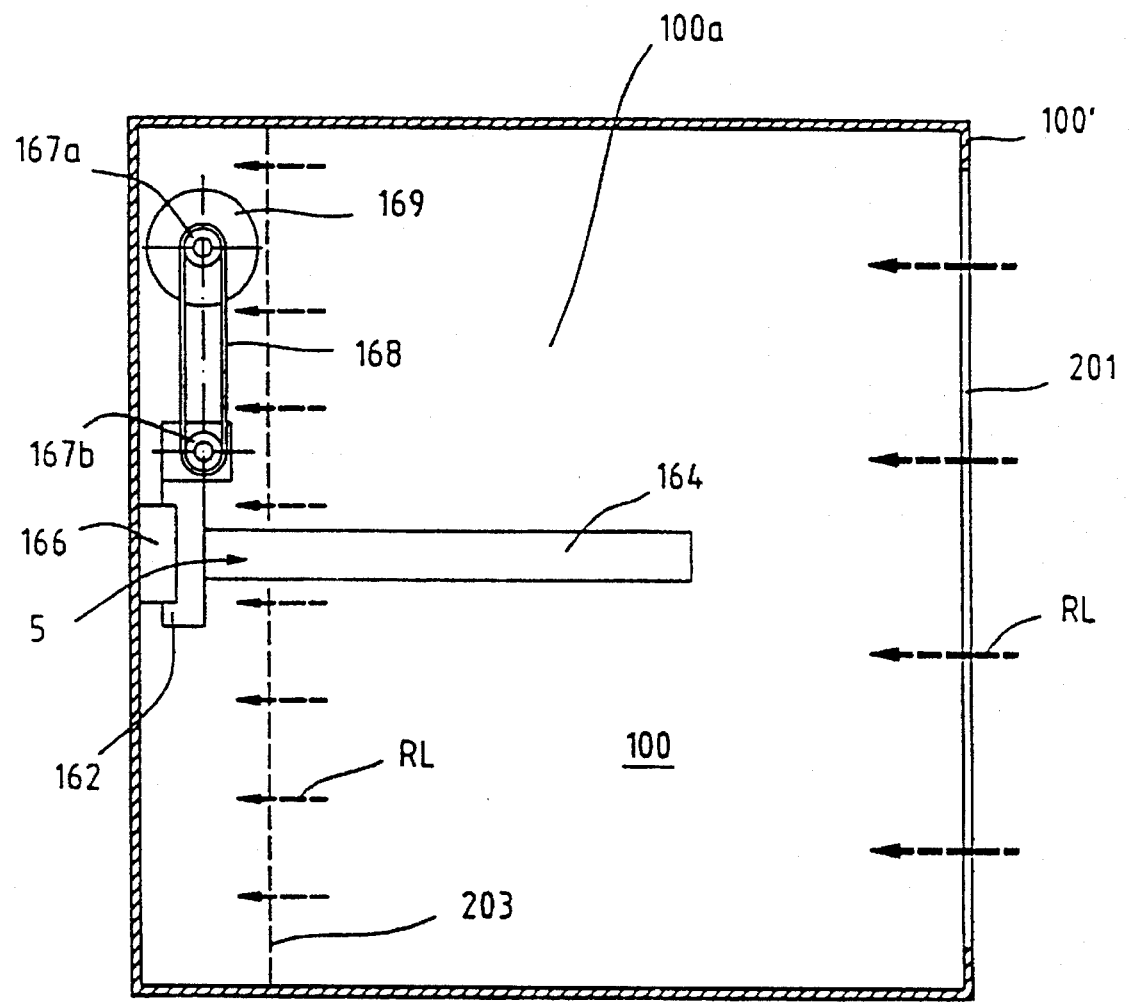

The lifting device 5 integrated into the clean room 100 (also see FIG. 12) has a threaded spindle 163 driven by an electric motor, by means of which a carriage 162 can be moved up and down along a guide rail 166. As best seen in FIG. 12, the drive of the threaded spindle 163 is provided by a drive motor 169 which provides the lifting movement of the carriage 162 extending in the direction of the arrow Z via a belt 168 and pulleys 167a, 167b. A support arm 164 fastened on the carriage 162 supports the lock gate 4 via leveling bolts 165a, 165b.

It is now important that a ventilating device 200 is integrated into the clean room 100. For this purpose a lateral wall 100' of the clean room 100 has an opening 201 through which clean air can be supplied to the clean room 100. The clean air flowing into the clean room 100 is identified by arrows RL in FIGS. 10 to 12. The supplied clean air RL flows through the clean room 100 and penetrates through a perforated plate 203, which encapsulates the mechanical parts and the drive of the lifting device integrated into the clean room 100, and is guided via an opening 205 in the housing bottom 204 of the clean room 100 into a ventilator housing 220 of the system, in which a ventilating unit 222 is disposed.

By means of this supply of clean air RL to the clean room 100 the technical air requirements of such a system for transferring substrates into clean rooms are met in an advantageous manner: the clean air RL, which preferably flows in parallel with the substrates 102, provides in an advantageous manner a washing of the substrates 201 contained in the cassette 101 and prevents air which is contaminated with airborne particulates possibly present in the clean room 100 from reaching the substrates 102 contained in the cassette 101. Thus the supplied clean air RL forms a displacement flow which keeps airborne particulates away from the substrates 102. In the course of this the perforated plate 203 of the clean room 100 provides an even aspiration—i.e. a steadying of the clean air flow—of the clean air RL through the openings 201 of the clean room 100 and in addition assures an even removal of the clean air RL through the opening 205 of the bottom 204 of the clean room 100 into the ventilator housing 220.

In this connection it is advantageous that the ventilating unit 222 is controllable, so that the speed of the displacement flow created by the clean air RL, which causes washing of the substrate 102, can be adapted to the respective external requirements—essentially the pressure gradient between in flowing and outflowing air—. By means of this it is assured that the ventilation device 200 of the described system can be adapted to individual requirements of the users.

The perforated sheet 203 provided in the clean room 100 furthermore provides—in addition to taking care of the even flow of clean air RL in the clean room 100—that abrasion particles created on the parts of the lifting device 5 subjected to friction can no longer directly reach the section 100a of the clean room 100 which contains the cassette 101 filled with substrates 102. Such a danger of contamination of the clean room section 100a by abrasion particles is also eliminated by the described routing of the clean air RL: because in addition to the section 100a of the clean room 100 containing the substrates 102, it also floods the lifting device 5, so that the abrasion particles—created for example in the course of the movement of the carriage 162 along the guide rail 166—are immediately removed through the opening 205 of the housing bottom 204 of the clean room 100 into the ventilator housing 220. Thus the exhaust air, symbolically represented by arrows AL, from the clean room 100 is removed by the ventilating unit 222 via the ventilator housing 220.

It is of course easily possible to employ the ventilating device 200 of the clean room 100 of the second exemplary embodiment also in the system for transferring substrates in accordance with the first exemplary embodiment.

Figure 13:
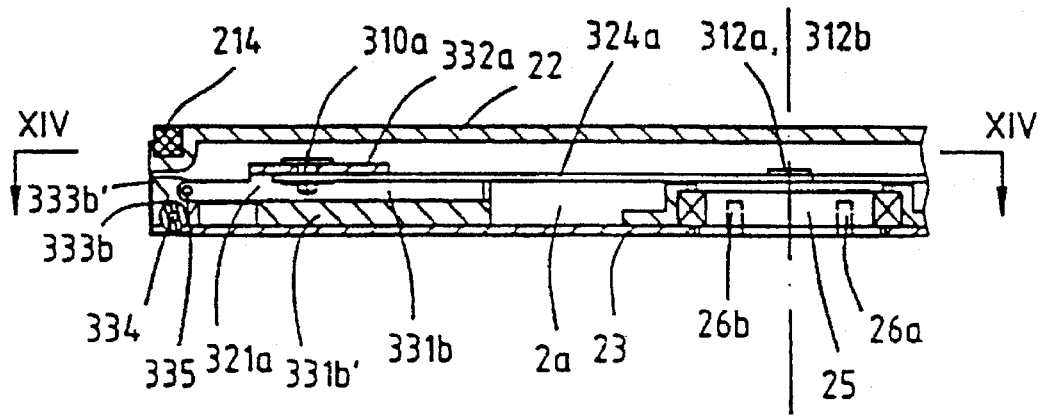
Figure 14:
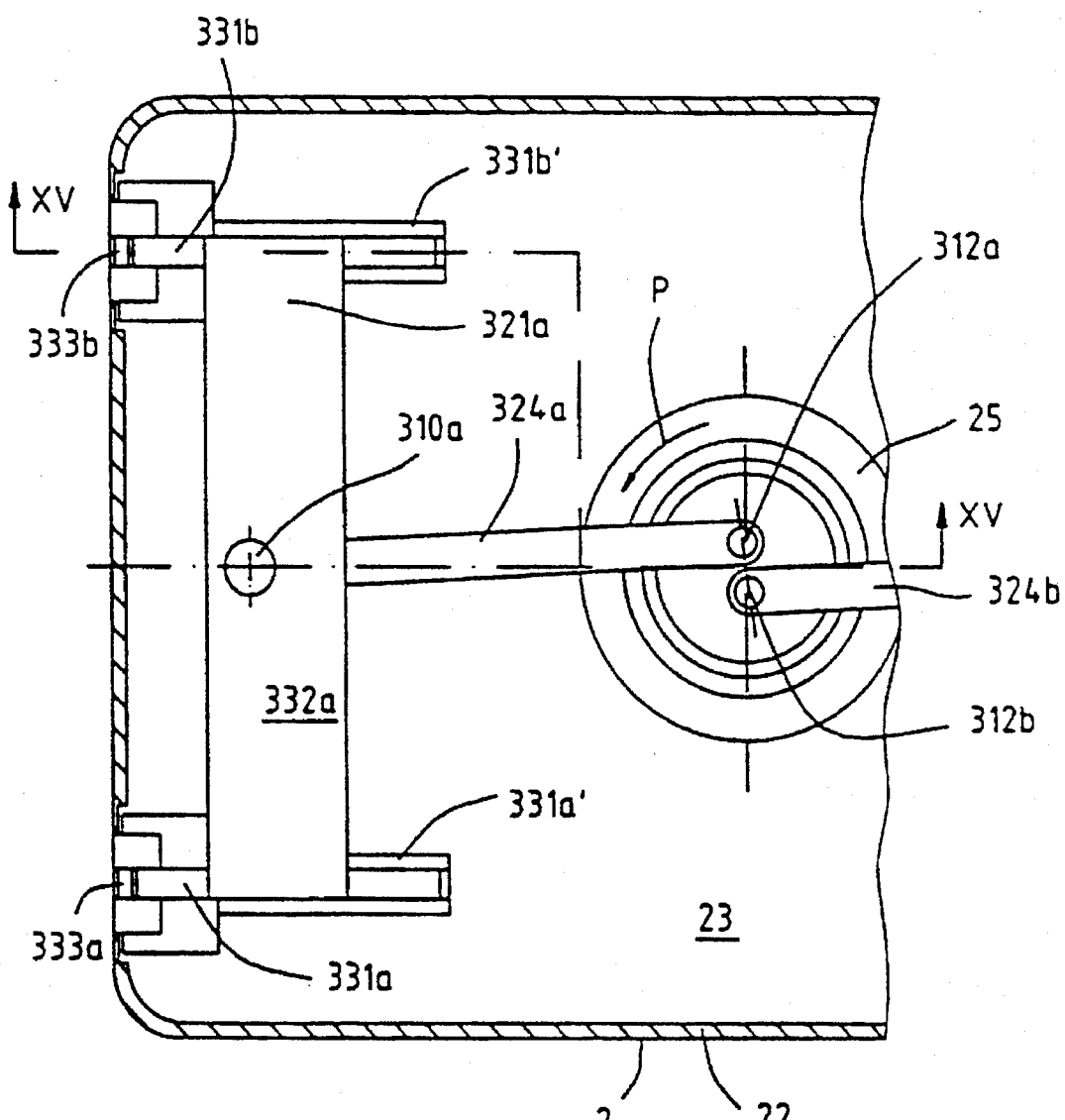
Figure 15:
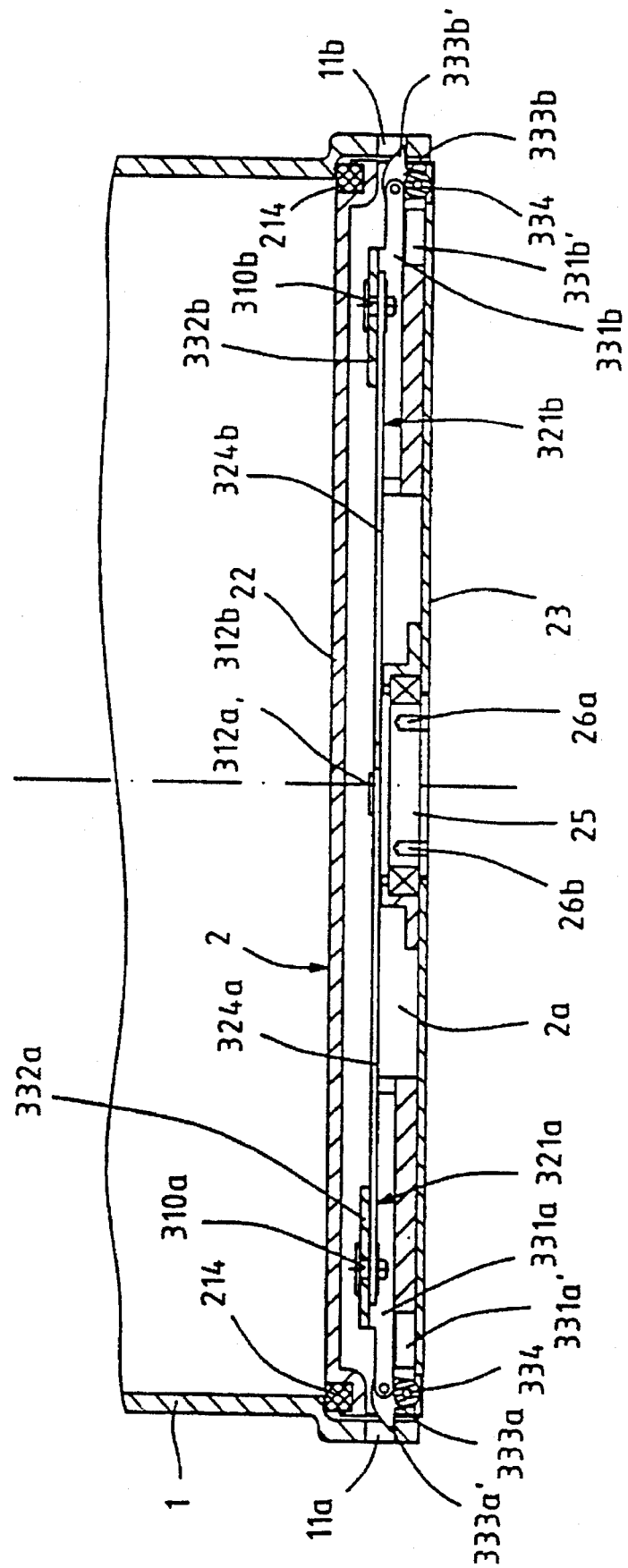
Figure 16:
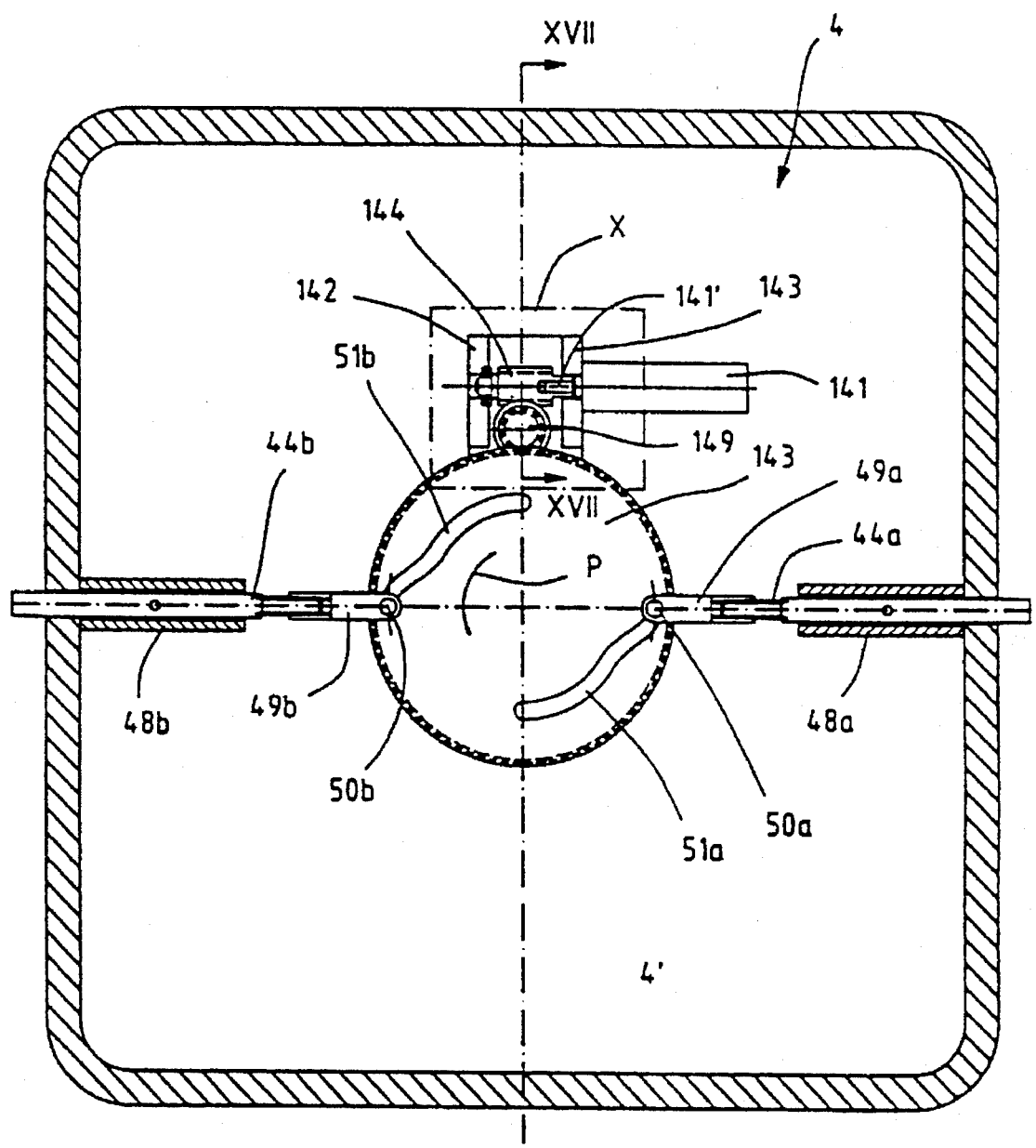

FIGS. 13 and 14, corresponding to FIGS. 3 and 4 of the first exemplary embodiment, as well as FIG. 15 illustrate a second embodiment of the locking mechanism for fixing in place the box bottom 2 in the box 1 disposed in the housing 22 of the box bottom 2. As can best be seen in FIG. 14—respectively one end of a push rod 324a, 324b is linked to the top of the pivot disk 25 via respectively a joint 312a, 312b, the other ends of which are connected via a respectively other joint 310a, 310b with locking elements 321a, 321b. Each locking element 321a and 321b has two sliders 331a, 331b, which are displaceably guided in respectively one guide element 331a', 331b' parallel with the underside 23 of the box bottom 2 and are coupled via yokes 332a, 332b. Respectively one bar 333a, 333b rotatably seated in a pivot point 334 is connected via a further joint 335 with the ends outside of the box of the sliders 331a, 331b.

If the pivot disk 25 is pivoted in the direction of the arrow P, the push rods 324a, 324b move their associated locking element 321a, 321b toward the outside, as a result of which the beak-like shaped bars 333a, 333b are forced to make a rotating movement around their pivot point 334. In the process, the beak-shaped ends 333a', 333b' of the bars 333a, 333b extend out of the housing 22 of the box bottom 2—as best seen in FIG. 15—and dip into the locking slots 11a, 11b of the box 1, which are disposed in the lower area 10 of the box 1 resting against the lateral surfaces 2' of the box bottom 2. A secure locking of the box bottom 2 in the box 1 is again achieved by this measure.

It has again been provided in an advantageous manner in the course of the pivot movement of the pivot disk 25 that the push rods 324a, 324b are moved beyond dead center of the joints 312a, 312b. At the end of their movement the push rods 324a, 324b embodied as toggle levers snap past their dead center and in this way lock in an advantageous manner against automatic opening. Because of this toggle lever effect by means of the push rods 324a, 324b occurring in the course of the locking movement of the bars 333a, 333b, a particularly strong force effect on the seal 214 of the box bottom 2 is again achieved, because of which it is pushed particularly strongly against the box 1. The extremely high locking force between the box 1 and the box bottom 2 generated by this toggle lever effect creates a perfect seal. The cassette 101 with the substrates 102 contained therein, which is received in the chamber hermetically closed by the box 1 and the box bottom 2, can therefore be transported without danger through a contaminated environment.

Figure 17:
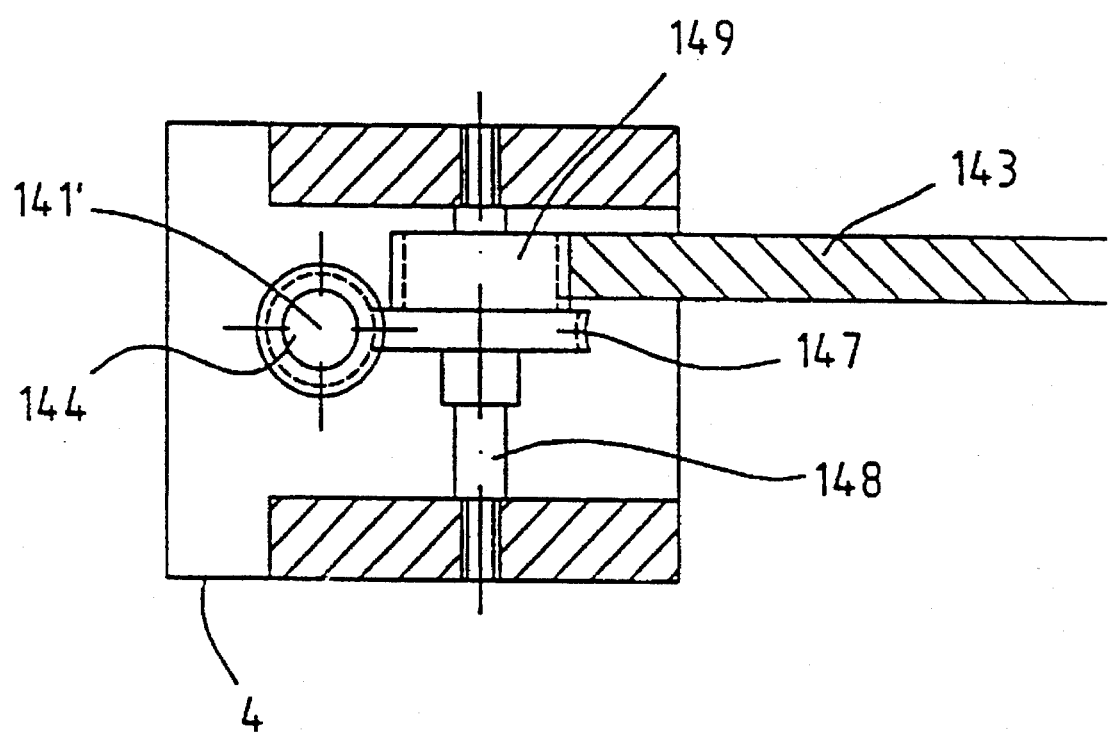

The second exemplary embodiment also differs from the first exemplary embodiment by the type of drive for the turntable 45 of the detent mechanism which fixes the box 1 together with the inserted box bottom 2 in place in the receiving frame 3. Reference is made in connection with this to FIGS. 16 and 17, in which the alternative embodiment of the detent mechanism of the first exemplary embodiment described in FIG. 9 is illustrated: a cam plate 143 corresponding to the cam plate 43 of FIG. 9 is now operated by means of the combined worm wheel—spur wheel gear. The cam plate 143, fixedly connected with the turntable 45, is embodied as a spur wheel which is engaged by a pinion 149. The pinion 149 and a worm wheel 147 fixedly connected with it are seated on a shaft 148 extending perpendicularly in respect to the underside 2' of the box bottom 2. A worm 144 is disposed perpendicularly to this on the motor shaft 141' of a gear motor 141. In this case the gear motor 141 and its motor shaft are seated on two cheeks 142 and 143.

The described arrangement of this common drive device for the detent and the locking mechanism has the advantage that because of this the gear motor 141 can be installed horizontally in the lock gate 4, by means of which it is possible in a particularly simple way to achieve their compact construction.

I claim:

1. A system for transferring substrates into a clean room, comprising:

a box for receiving a cassette containing substrates, said box including a plurality of locking slots;

a box bottom which hermetically seals the box and which can be locked into and unlocked from said box;

a receiving frame for receiving said box adjacent said box bottom and orienting said box relative to the clean room;

a locking mechanism for locking said box bottom to said box, said locking mechanism including a pivot disk rotatably mounted in said box bottom, said pivot disk having a plurality of engagement bores, a plurality of push rods and an equal plurality of locking elements displaced by said pivot disk via respective ones of said push rods to engage a respective one of said locking slots;

a lock gate connected to said receiving frame, said lock gate having a turntable mounted therein, said turntable having a plurality of locking pins which engage respective ones of said engagement bores of said pivot disk thereby connecting said turntable to said pivot disk; and a detent mechanism for fixing in place said box in said receiving frame, wherein driving of said turntable by an operating device of the system causes pivotal movement of said turntable which triggers locking of said box bottom in said box causing termination of said fixing in place of said box in said receiving frame, and which triggers unlocking of said box bottom in said box causing fixing in place of said box in said receiving frame.

2. The system as defined in claim 1, wherein said box further has a plurality of shoulders and said receiving frame receives a plurality of detent elements, equal in number to said plurality of shoulders, wherein said detent mechanism includes said plurality of detent elements, a cam-plate, a plurality of push rods, each having a guide bolt extending therefrom, and a plurality of control cams connected to said cam plate, with a respective one of the guide bolts extending from said push rods being guided by a respective one of said control cams, and wherein the rotary motion of said turntable is translated into a pivotal movement of said detent elements acting on a respective one of said shoulders.

3. The system as defined in claim 2, wherein said receiving frame includes a plurality of cutouts, wherein said detent mechanism includes a plurality of bolts, one end of which defines one of said plurality of detent elements and the other end of which define a pivot lever on which a respective one of said plurality of further push rods acts, and a pivot spring coaxially, operatively associated with each bolt, with one end of each spring being connected with its respective bolt and its other end being supported by said receiving frame, and wherein with retraction of one of said plurality of further push rods, the associated detent element is pivoted by the force of its associated spring out of its associated cutout and into its detent position.

4. The system as defined in claim 2, wherein said box bottom includes a plurality of runners, each connected to a respective one of said locking elements, wherein each control cam has a first area defining a constant radius and a following second area in which the radius is defined to increase in such a way that passage of its respective guide bolt therethrough leads to a displacement movement which cooperates with a respective runner to limit the linear displacement movement of the associated locking element, triggered by an associated push rod, in the direction of an associated locking slot, and that with further movement of the associated push rod in the displacement direction the associated locking element is tilted.

5. The system as defined in claim 4, wherein said push rods are embodied as toggle levers.

6. The system as defined in claim 1, wherein said locking mechanism further includes a plurality of rotatably seated bars each defining a pivot point and a plurality of guide elements, and wherein each locking element has at least one slider which is displaceably guided in one of said plurality of guide elements, each slider being linked to one of said plurality of rotatably seated bars, said bars serving to translate the linear displacement movement of its associated locking element, in the direction of the associated locking slot, into a rotating movement around said pivot point of said bar, by means of which said box bottom is locked in said box.

7. The system as defined in claim 6, wherein the end of each bar is beak-shaped.

8. The system as defined in claim 1, wherein each push rod in its connection to said pivot disk defines a joint, and wherein each push rod can be moved beyond dead center of its defined joint in the course of their movement causing locking of said box bottom in said box.

9. The system as defined in claim 1, further comprising: a ventilating device for the clean room, said ventilating device supplying a clean air flow to the clean room which flows around the substrates, and including means for removing the air flow from the clean room after it flows around the substrates.

10. The system as defined in claim 9, wherein said means for removing the air flow from the clean room comprises a ventilating unit integrated into the clean room.

11. The system as defined in claim 9, wherein said ventilating device includes a grid element in the clean room for steadying the clean air flow flowing through the clean room.

12. The system as defined in claim 9, wherein said ventilating device directs the clean air flow parallel to the surface of the substrate around which it flows.

13. The system as defined in claim 9, further comprising: a lifting device integrated into the clean room for said lock gate, and wherein the clean air flow is guided to said lifting device after it passes around the substrates.

14. The system as defined in claim 13, wherein said ventilating device includes a grid element in the clean room for steadying the clean air flow flowing through the clean room, and wherein said grid element is disposed ahead of said lifting device in the direction of clean air flow.

15. The system as defined in claim 13, wherein said lifting device includes a carriage, a driven threaded spindle and a support arm, said driven threaded spindle serving to lift said support arm which acts on said lock gate.

16. The system as defined in claim 1, further comprising: a substrate fixing device disposed in said box.

17. The system as defined in claim 16, wherein said substrate fixing device includes a scissors brace and a pressure strip connected with the scissors brace, and wherein said scissors brace cooperates with said box bottom by means of which a lifting movement of said box bottom is translated into a pressing movement by said pressure strip against the substrates in the cassette.

18. The system as defined in claim 1, further comprising: an operating device which drives said locking mechanism and said detent mechanism, and wherein said operating device is completely disposed within said lock gate.

19. The system as defined in claim 18, wherein said operating device includes a bracket hinged to said lock gate, a motor with a gear received within said bracket, a threaded spindle, and a fork having a counter-screw thread, said fork being hinged to said cam plate, and wherein said threaded spindle is flanged to a shaft of said motor and meshes with the counter-screw thread of said fork.

20. The system as defined in claim 18, wherein said operating device includes a pinion in engagement with said cam plate formed as a spur wheel, a worm wheel fixedly connected with said pinion, a gear motor having a motor shaft, and a worm connected to said motor shaft and flanged to engage with said worm wheel.

21. The system as defined in claim 1, wherein said box bottom includes a housing, a plurality of runners, each connected to a respective one of said locking elements, and a plurality of stops equal in number to the plurality of runners, wherein at least one of said runners slides on the underside of said housing and engages, as a limit, a respective one of said stops, said movement of said runners toward its respective stop being triggered by its associated push rod moving in the direction of its associated locking slot, with further movement of said push rod in the direction of its associated locking slot causing its associated locking element to tilt.

22. An SMIF-system for transferring substrates into the lock of a clean room with a box for receiving a cassette containing the substrates, comprising:
a ventilating device provided in the clean room for supplying an air flow to the clean room which flows around the substrates, wherein the clean room has an inlet opening and an exhaust opening, said ventilating device having a ventilating unit disposed on the exhaust opening side of the clean room for removing the clean air flow flowing through the clean room and for generating a displacement flow which is caused by a pressure gradient between the clean air flow flowing through said inlet opening from an adjoining further clean room and the flow at said exhaust opening.

23. The system as defined in claim 22, further comprising:

a lifting device integrated into the clean room, and wherein said ventilating device includes a grid element in the clean room for steadying the clean air flow flowing through the clean air room and for screening said lifting device.

24. The system as defined in claim 23, wherein said ventilating device directs the clean air flow parallel to the surface of the substrate around which it flows.

25. The system as defined in claim 22, further comprising:

a lifting device integrated into the clean room, and wherein the clean air flow is guided to said lifting device after it passes around the substrates.

26. The system as defined in claim 25, wherein said ventilating device includes a grid element in the clean room for steadying the clean air flow through the clean room, and wherein said grid element is disposed ahead of said lifting device in the direction of clean air flow.

* * * * *